United States Patent
Park

(10) Patent No.: US 7,154,365 B2
(45) Date of Patent: Dec. 26, 2006

(54) APPARATUS FOR FIXING BOBBIN TO PRINTED CIRCUIT BOARD FOR USE IN TRANSFORMER

(75) Inventor: Cheol-jin Park, Suwon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 10/615,991

(22) Filed: Jul. 10, 2003

(65) Prior Publication Data

US 2004/0026123 A1 Feb. 12, 2004

(30) Foreign Application Priority Data

Aug. 9, 2002 (KR) .......................... 2002-0047137

(51) Int. Cl.
*H01F 27/30* (2006.01)

(52) U.S. Cl. ...................................... 336/198; 336/192

(58) Field of Classification Search ................. 336/65, 336/83, 107, 192, 198, 200, 232
See application file for complete search history.

(56) References Cited

U.S. PATENT DOCUMENTS

| | | | |
|---|---|---|---|
| 5,165,056 A * | 11/1992 | Chien-heng | 336/65 |
| 5,446,958 A * | 9/1995 | Hoang | 29/605 |
| 5,859,577 A * | 1/1999 | Nihei et al. | 336/92 |
| 5,896,077 A * | 4/1999 | Cadwallader | 336/192 |
| 6,069,550 A * | 5/2000 | Huang | 336/192 |
| 6,208,232 B1 * | 3/2001 | Chen | 336/192 |
| 6,441,714 B1 * | 8/2002 | Maeda | 336/198 |
| 2002/0057029 A1 * | 5/2002 | Kataja | 310/194 |
| 2002/0070833 A1 * | 6/2002 | Junjie et al. | 336/198 |

FOREIGN PATENT DOCUMENTS

| | | |
|---|---|---|
| CN | 1292636 A | 4/2001 |
| JP | 04-127510 | 4/1992 |
| JP | 10-189355 | 7/1998 |

\* cited by examiner

*Primary Examiner*—Tuyen T Nguyen
(74) *Attorney, Agent, or Firm*—Sughrue Mion, PLLC

(57) ABSTRACT

An apparatus for fixing a bobbin to a printed circuit board for use in a transformer includes a receiving hole formed in the printed circuit board, a size of which is minutely larger than that of the bobbin to hold the bobbin, and a horizontal support portion formed at the pins of the bobbin in parallel relation to an upper surface of the printed circuit board, for allowing the bobbin to be supported on the upper surface of the printed circuit board when the bobbin is inserted into the receiving hole. Accordingly, the apparatus for fixing the bobbin to the printed circuit board for use in the transformer can make the installation height of the transformer installed on the printed circuit board slim, thereby decreasing a thickness of the electronic product employing the transformer 10 and thus improving convenience in use.

3 Claims, 2 Drawing Sheets

APPARATUS FOR FIXING BOBBIN TO PRINTED CIRCUIT BOARD FOR USE IN TRANSFORMER

BACKGROUND OF THE INVENTION

1. Field of the Invention

The present invention relates to a transformer used in a power supply device of a variety of electronic products, and more particularly to an apparatus for fixing a bobbin to a printed circuit board for use in a transformer, by which the transformer becomes slim in its installation height when the transformer is installed on the printed circuit board. The present invention is based on Korean Patent Application No. 2002-47137, which is incorporated herein by reference.

2. Description of the Prior Art

As shown in FIG. 1, a transformer 1 is generally comprised of a bobbin 2 and an E-type core 5. Around an upper portion of the bobbin 2 is wound a coil 3, and at a lower portion of the bobbin 2 are provided a plurality of lead pins 7 connected to an end of the coil 3 and a protruding support portion 6 for supporting the lead pins 7 to space the lead pins 7 apart from a printed circuit board 4 by a predetermined distance. The core 5 is inserted into a middle of the bobbin 2 around which the coil 3 is wound.

The lead pins 7 protruding downward from the bobbin 2 are inserted and soldered into fixing openings 4a formed in the printed circuit board 4 that is employed in an electronic product such as a TV, a monitor, and the like.

Accordingly, when the transformer 1 operates and generates a voltage in the coil 3 wound around the upper portion of the bobbin 2, the generated voltage is supplied to the electronic product such as the TV, the monitor and the like connected to the printed circuit board 4 through the lead pins 7.

The transformer 1, however, is structured in a manner that the lead pins 7 of the bobbin 2 are supported on the protruding support portion 6, while being spaced apart from the printed circuit board 4 by the predetermined distance, and thus has a problem that an installation height of the transformer 1 is higher as much as the height of the protruding support portion 6.

As the installation height of the transformer 1 becomes higher, the electronic product becomes thicker. Therefore, there is a problem of inconvenience in use.

In order to prevent the installation height of the transformer 1 from becoming higher, the use of a surface mount device (SMD) type transformer can be considered. However, the SMD type transformer deteriorates work efficiency and thus increases a probability of inferior product, and also has a restriction of voltage capacity and thus cannot be applied in an apparatus of high capacity.

SUMMARY OF THE INVENTION

The present invention has been developed in order to solve the above problems in the prior art. Accordingly, an aspect of the present invention is to provide an apparatus for fixing a bobbin to a printed circuit board for use in a transformer, by which the transformer becomes slim in its installation height when the transformer is installed on the printed circuit board.

The above aspect is achieved by providing an apparatus for fixing a bobbin to a printed circuit board for use in a transformer. Around an upper portion of the bobbin is wound a coil, and a lower portion of the bobbin is provided with a plurality of pins connected to an end of the coil and connected to the printed circuit board of an electronic product. The apparatus for fixing the bobbin to the printed circuit board comprises a receiving hole formed in the printed circuit board, a size of which is minutely larger than that of the bobbin to hold the bobbin, and a horizontal support portion formed at the pins of the bobbin in parallel relation to an upper surface of the printed circuit board, for allowing the bobbin to be supported on the upper surface of the printed circuit board when the bobbin is inserted into the receiving hole.

According to a preferred embodiment, the apparatus for fixing the bobbin to the printed circuit board for use in the transformer further comprises a fixing portion extending from the horizontal support portion in a perpendicular relation to the upper surface of the printed circuit board so that the pins are inserted into a fixing opening formed in the printed circuit board.

BRIEF DESCRIPTION OF THE DRAWINGS

The above aspect and a feature of the present invention becomes apparent by describing a preferred embodiment of the present invention with reference to the accompanying drawings, in which.

DETAILED DESCRIPTION OF ILLUSTRATIVE EMBODIMENTS

Hereinafter, an apparatus for fixing a bobbin to a printed circuit board for use in a transformer according to a non-limiting, illustrative embodiment of the present invention will be described in greater detail with reference to the accompanying drawings.

Figure 3:
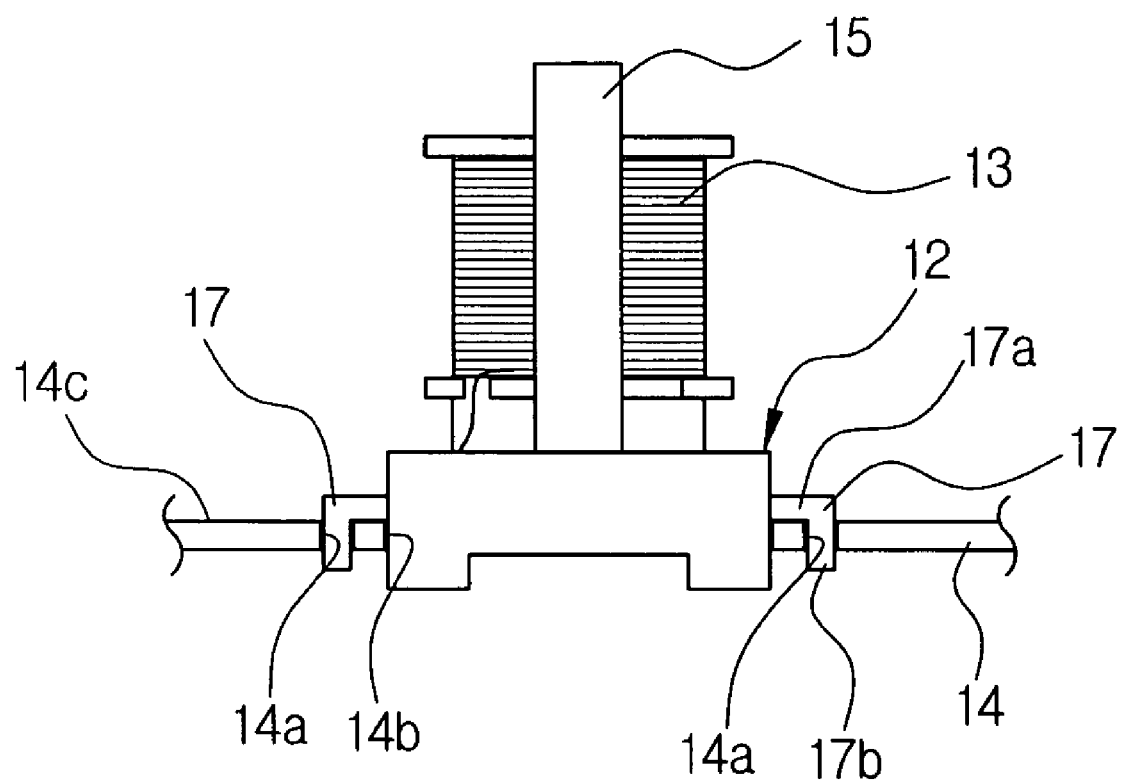
FIG. 3 is a side section view showing a transformer employing an apparatus for fixing bobbin to a printed circuit board according to the present invention.

FIG. 3 schematically shows a transformer 10 employing an apparatus for fixing a bobbin to a printed circuit board of the present invention by way of an example.

The transformer 10 includes a bobbin 12 and an E-type core 15.

Around an upper portion of the bobbin 12 is wound a coil 13, and at a lower portion of the bobbin 12 are provided a plurality of lead pins 17 connected to an end of the coil 13 and connected to a printed circuit board 14 of an electronic product. The core 15 is inserted into a middle of the bobbin 12 around which the coil 13 is wound.

The apparatus for fixing the bobbin 12 to the printed circuit board 14 for use in the transformer 10, includes a receiving hole 14b formed in the printed circuit board 14, a size of which is minutely larger than that of the bobbin 12, for holding the bobbin 12, and horizontal support portions 17a formed at the lead pins in a parallel relation to an upper surface 14c of the printed circuit board 14, for allowing the bobbin 12 to be supported on the upper surface 14c of the printed circuit board 14 when the bobbin 12 is inserted into the receiving holes 14b.

The lead pins 17 are inserted into and soldered with fixing openings 14a formed in the printed circuit board 14 with fixing portions 17b extending from the horizontal support portions 17a in a perpendicular relation to the upper surface 14c of the printed circuit board 14.

Accordingly, the bobbin 12 is inserted into the receiving hole 14b so that the horizontal support portions 17a of the lead pins 17 are supported on the upper surface 14c of the printed circuit board 14 and the fixing portions 17b of the lead pins 17 are inserted into the fixing openings 14a of the printed circuit board 14, and then the fixing portions 17b of the lead pins 17 are soldered with the printed circuit board 14, thereby completing the fixing of the bobbin 17 to the printed circuit board 14.

Figure 1:
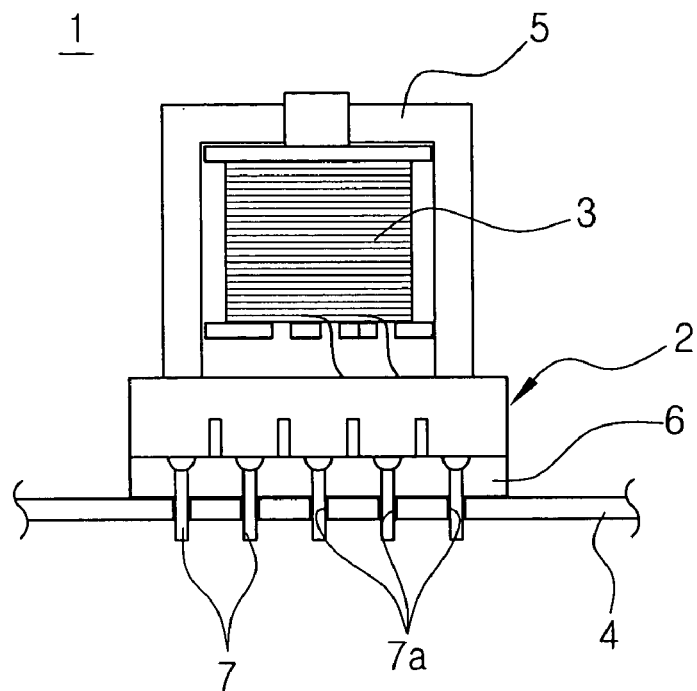
FIG. 1 is a front view showing a conventional transformer.
Figure 2:
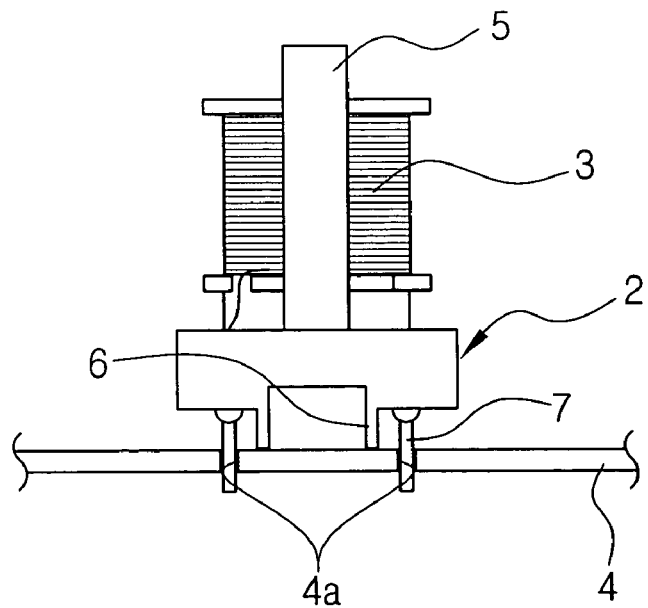
FIG. 2 is a side section view showing the transformer of FIG. 2.

The apparatus for fixing the bobbin 17 to the printed circuit board 14 according to the present invention can allow the transformer 10 to have an installation height that is lower than that of the conventional transformer 1 as shown in FIGS. 1 and 2 as much as the thickness of the protruding support portion 6 and the printed circuit board 4 of the conventional transformer 1.

As described above, the apparatus for fixing the bobbin 12 to the printed circuit board 14 for use in the transformer 10 of the present invention can make the installation height of the transformer installed on the printed circuit board slim, thereby decreasing a thickness of the electronic product employing the transformer 10 and thus improving convenience in use.

The foregoing embodiment and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A transformer, comprising:
    a printed circuit board comprising a receiving hole and an upper surface;
    a bobbin inserted into the receiving hole of the printed circuit board, the bobbin comprising:
    a winding axis around which is wound a coil, the winding axis being perpendicular to the upper surface of the printed circuit board;
    a lower portion at one end of the winding axis;
    a plurality of pins connected to the lower portion, each pin comprising a horizontal support portion that extends in parallel contact with the upper surface of the printed circuit board to support the bobbin on the printed circuit board,
    wherein a diameter of the receiving hole is minutely larger than a diameter of the portion of the bobbin inserted therein, to hold the bobbin,
    each pin further comprising a fixing portion extending from the horizontal support portion in a perpendicular relation to the upper surface of the printed circuit board to extend into an opening in the printed circuit board.

2. The transformer of claim 1, wherein a radially inner face of the receiving hole and a radially outer face of the bobbin adjacent to the radially inner face of the receiving hole are perpendicular to the upper surface of the printed circuit board throughout a total thickness of the circuit board.

3. The transformer of claim 1, wherein a plurality of pins with horizontal support portions are formed, and the plurality of horizontal support portions support the entire weight of the bobbin on the printed circuit board.

* * * * *